United States Patent
Lee et al.

(10) Patent No.: US 11,876,031 B2
(45) Date of Patent: Jan. 16, 2024

(54) THERMAL INTERFACE MATERIAL PASTE AND SEMICONDUCTOR PACKAGE

(71) Applicant: SAMSUNG ELECTRONICS CO., LTD., Suwon-si (KR)

(72) Inventors: Joungphil Lee, Seoul (KR); Wonkeun Kim, Hwaseong-si (KR); Mihyae Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 17/376,600

(22) Filed: Jul. 15, 2021

(65) Prior Publication Data

US 2022/0020664 A1 Jan. 20, 2022

(30) Foreign Application Priority Data

Jul. 17, 2020 (KR) .................. 10-2020-0089164

(51) Int. Cl.
| | |
|---|---|
| *H01L 23/373* | (2006.01) |
| *H01L 23/31* | (2006.01) |
| *H01L 23/552* | (2006.01) |
| *H01L 25/065* | (2023.01) |
| *H01L 25/10* | (2006.01) |
| *H01L 23/367* | (2006.01) |

(52) U.S. Cl.
CPC ...... *H01L 23/3737* (2013.01); *H01L 23/3128* (2013.01); *H01L 23/3675* (2013.01); *H01L 23/552* (2013.01); *H01L 25/0652* (2013.01); *H01L 25/0655* (2013.01); *H01L 25/0657* (2013.01); *H01L 25/105* (2013.01); *H01L 2225/0651* (2013.01); *H01L 2225/06513* (2013.01); *H01L 2225/06537* (2013.01); *H01L 2225/06541* (2013.01); *H01L 2225/06568* (2013.01); *H01L 2225/06586* (2013.01); *H01L 2225/06589* (2013.01); *H01L 2225/1035* (2013.01); *H01L 2225/1041* (2013.01); *H01L 2225/1058* (2013.01)

(58) Field of Classification Search
None
See application file for complete search history.

(56) References Cited

U.S. PATENT DOCUMENTS

| | | | |
|---|---|---|---|
| 6,630,371 B2 | 10/2003 | Hembree | |
| 8,040,676 B2 | 10/2011 | Kluge | |
| 8,319,335 B2 | 11/2012 | Bayerer et al. | |
| 8,375,576 B2 | 2/2013 | Kwon | |
| 8,748,228 B2 * | 6/2014 | Kim | H01L 23/49816 438/122 |

(Continued)

FOREIGN PATENT DOCUMENTS

| | | |
|---|---|---|
| CN | 105713597 A | 6/2016 |
| DE | 102011083224 A1 | 3/2013 |
| KR | 10-1829392 B1 | 2/2018 |

*Primary Examiner* — Long Pham
(74) *Attorney, Agent, or Firm* — Muir Patent Law, PLLC

(57) ABSTRACT

A semiconductor package includes at least one semiconductor device mounted on a first substrate, a thermosetting resin layer on the at least one semiconductor device, the thermosetting resin layer including an irreversible thermochromic pigment, a metal plate on the thermosetting resin layer, and a molding member surrounding the at least one semiconductor device at least in a lateral direction and being in contact with the thermosetting resin layer.

18 Claims, 9 Drawing Sheets

(56) References Cited

U.S. PATENT DOCUMENTS

| | | |
|---|---|---|
| 9,070,666 B2 | 6/2015 | Mamitsu et al. |
| 9,922,935 B2 * | 3/2018 | Kim .................. H01L 23/562 |
| 10,297,554 B2 * | 5/2019 | Kim .................. H01L 23/562 |
| 2006/0214666 A1 | 9/2006 | Chou et al. |
| 2016/0079178 A1 * | 3/2016 | Kim ................ H01L 21/4853 |
| | | 257/773 |
| 2019/0287920 A1 | 9/2019 | Lee et al. |

* cited by examiner

THERMAL INTERFACE MATERIAL PASTE AND SEMICONDUCTOR PACKAGE

CROSS-REFERENCE TO RELATED APPLICATION

Korean Patent Application No. 10-2020-0089164, filed on Jul. 17, 2020, in the Korean Intellectual Property Office, and entitled: "Thermal Interface Material Paste and Semiconductor Package," is incorporated by reference herein in its entirety.

BACKGROUND

1. Field

Embodiments relate to thermal interface material paste and a semiconductor package.

2. Description of the Related Art

With the compactness and high performance of semiconductor devices, heat may be generated during manufacturing of the semiconductor devices. For example, excess heat during manufacturing of the semiconductor devices may cause failure of the semiconductor devices.

SUMMARY

According to an aspect of embodiments, there is provided a semiconductor package including at least one semiconductor device mounted on a first substrate, a thermosetting resin layer on the at least one semiconductor device and including an irreversible thermochromic pigment, a metal plate on the thermosetting resin layer, and a molding member surrounding the at least one semiconductor device at least in a lateral direction and being in contact with the thermosetting resin layer.

According to another aspect of embodiments, there is provided a semiconductor package including at least one semiconductor device mounted on a first substrate, a first thermosetting resin layer on the at least one semiconductor device, a second thermosetting resin layer between the at least one semiconductor device and the first substrate, and a metal plate on the first thermosetting resin layer, wherein at least one of the first thermosetting resin layer and the second thermosetting resin layer includes an irreversible thermochromic pigment.

According to still another aspect of embodiments, there is provided a semiconductor package including a first semiconductor device mounted on an interposer, a second semiconductor device on the interposer to be adjacent to the first semiconductor device in a lateral direction, a package substrate below the interposer, a heat dissipation unit surrounding top and side surfaces of each of the first semiconductor device, the second semiconductor device, and the interposer, and a thermosetting resin layer between the first semiconductor device and the heat dissipation unit and between the second semiconductor device and the heat dissipation unit, wherein the thermosetting resin layer includes a matrix polymer, an irreversible thermochromic pigment, a cross-linking agent, and a filler, and a content of the irreversible thermochromic pigment in the thermosetting resin layer is about 0.1 wt % to about 5 wt %.

According to a further aspect of embodiments, there is provided thermal interface material (TIM) paste including a matrix polymer, an irreversible thermochromic pigment uniformly dispersed in the matrix polymer, a cross-linking agent, a cross-linking regulator, wherein the matrix polymer includes thermosetting resin, a color change temperature of the irreversible thermochromic pigment is about 60° C. to about 400° C., and a content of the irreversible thermochromic pigment is about 0.1 wt % to about 5 wt %.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
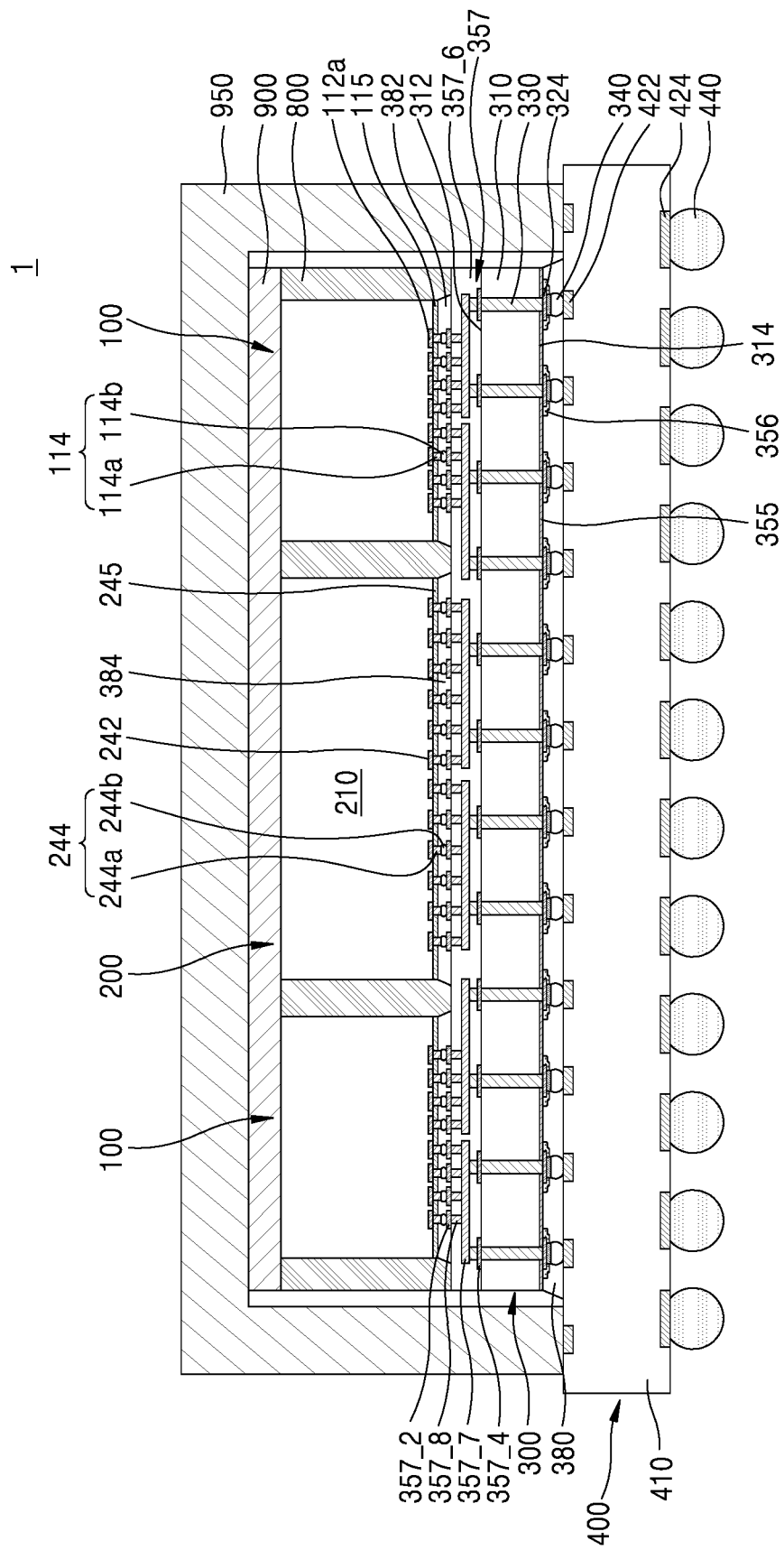
FIG. 1A is a cross-sectional view of a semiconductor package, according to an embodiment.
Figure 1B:
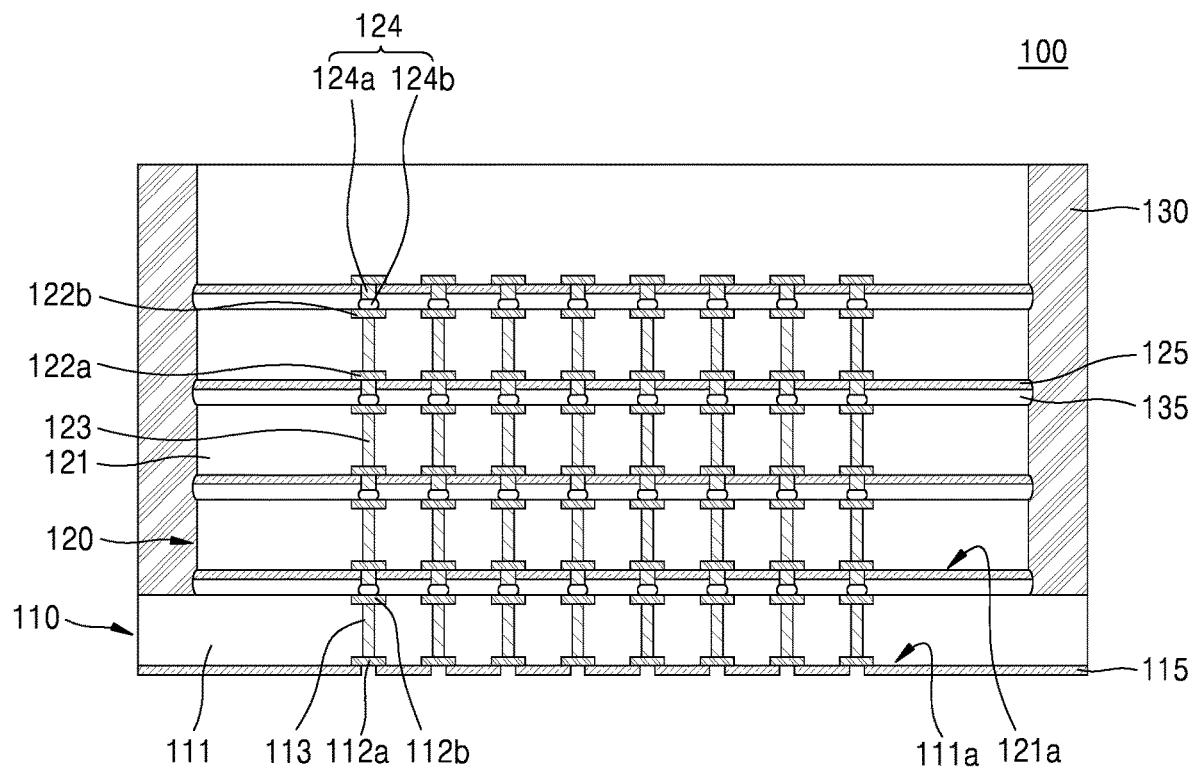
FIG. 1B is a cross-sectional view of a first semiconductor device included in a semiconductor package, according to an embodiment.

FIG. 1A is a cross-sectional view of a semiconductor package 1, according to an embodiment. FIG. 1B is a cross-sectional view of a first semiconductor device 100 included in the semiconductor package 1, according to an embodiment.

Referring to FIGS. 1A and 1B, the semiconductor package 1 may include a second substrate 400, a first substrate 300 mounted on the second substrate 400, and the first semiconductor device 100 and a second semiconductor device 200, which are mounted on the first substrate 300. The first semiconductor device 100 and the second semiconductor device 200 may be mounted on a redistribution structure 357 of the first substrate 300 to be adjacent to each other in a horizontal direction. At this time, the first semiconductor device 100 is separated from the second semiconductor device 200 in a lateral direction, e.g., in a horizontal direction parallel to a top surface of the first substrate 300.

The first semiconductor device 100 may be electrically connected to the first substrate 300 by a plurality of first connectors 114, and the second semiconductor device 200 may be electrically connected to the first substrate 300 by a plurality of second connectors 244. The first semiconductor device 100 may include a plurality of first top connection pads 112a, and the second semiconductor device 200 may include a plurality of second top connection pads 242. The first substrate 300 may include a plurality of first redistribution pads 357_2. The first connectors 114 may be between first top connection pads 112a and some of the first redistribution pads 357_2. The second connectors 244 may be between the second top connection pads 242 and some of the first redistribution pads 357_2.

Each of the first connectors 114 may include a first conductive pillar 114a on a first top connection pad 112a and a first conductive cap 114b on the first conductive pillar 114a. Each of the second connectors 244 may include a second conductive pillar 244a on a second top connection pad 242 and a second conductive cap 244b on the second conductive pillar 244a.

The first semiconductor device 100 may include a first semiconductor chip 110 and a plurality of second semiconductor chips 120. Although the first semiconductor device 100 includes four second semiconductor chips 120 in FIG. 1B, embodiments are not limited thereto. For example, the first semiconductor device 100 may include at least two second semiconductor chips 120. In some embodiments, the number of second semiconductor chips 120 included in the first semiconductor device 100 may be a multiple of four. The second semiconductor chips 120 may be sequentially stacked on the first semiconductor chip 110 in a vertical direction. The first semiconductor chip 110 and the second semiconductor chips 120 may be sequentially stacked such that an active side of each of the first semiconductor chip 110 and the second semiconductor chips 120 faces downwardly, i.e., toward the first substrate 300.

The first semiconductor chip 110 may include a first semiconductor substrate 111 having a first semiconductor element 111a on an active side, e.g., the first semiconductor element 111a may be embedded in the first semiconductor substrate 111 adjacent the active side. The first semiconductor chip 110 may further include the first top connection pad 112a and a first bottom connection pad 112b respectively on the active side and the inactive side of the first semiconductor substrate 111, a first through electrode 113 passing through at least a portion of the first semiconductor substrate 111 and electrically connecting the first top connection pad 112a to the first bottom connection pad 112b, and a first protective insulating layer 115 exposing at least a portion of the first top connection pad 112a and covering the active side of the first semiconductor substrate 111.

For example, the first semiconductor substrate 111 may include a semiconductor material, e.g., silicon (Si). In another example, the first semiconductor substrate 111 may include a semiconductor element, e.g., germanium (Ge), or a compound semiconductor, e.g., silicon carbide (SiC), gallium arsenide (GaAs), indium arsenide (InAs), or indium phosphide (InP). The first semiconductor substrate 111 may include a conductive region, e.g., an impurity-doped well. The first semiconductor substrate 111 may have various isolation structures including a shallow trench isolation (STI) structure.

In this specification, a top surface and a bottom surface of a semiconductor substrate, e.g., the first semiconductor substrate 111, respectively refer to an active side and an inactive side of the semiconductor substrate. In other words, even when the active side of the semiconductor substrate is located below the inactive side in an end product, the active side of the semiconductor substrate is referred to as the top surface and the inactive side of the semiconductor substrate is referred to as the bottom surface in this specification. The term "top" may be used for elements located on the active side of the semiconductor substrate and the term "bottom" may be used for elements located on the inactive side of the semiconductor substrate.

The first semiconductor element 111a may include various microelectronic devices, e.g., a metal-oxide-semiconductor field effect transistor (MOSFET) such as a complementary metal-oxide-semiconductor (CMOS) transistor, a system large scale integration (LSI), an image sensor such as a CMOS image sensor (CIS), a micro-electro-mechanical system (MEMS), an active element, and a passive element. The first semiconductor element 111a may be electrically connected to the conductive region of the first semiconductor substrate 111. The first semiconductor element 111a may be electrically isolated from an adjacent first semiconductor element 111a by an insulating film.

In some embodiments, the first semiconductor chip 110 may include, e.g., a dynamic random access memory (DRAM) chip, a static RAM (SRAM) chip, a flash memory chip, an electrically erasable and programmable ROM (EE-PROM) chip, a phase-change RAM (PRAM) chip, a magnetic RAM (MRAM) chip, or a resistive RAM (RRAM) chip. In some embodiments, the first semiconductor chip 110 may include a central processing unit (CPU) chip, a graphics processing unit (GPU) chip, or an application processor (AP) chip.

In some embodiments, the first semiconductor chip 110 may include a high-bandwidth memory (HBM) DRAM semiconductor chip. In some embodiments, the first semiconductor chip 110 may include a buffer chip including a serial-parallel conversion circuit. In some embodiments, the first semiconductor chip 110 may include a buffer chip for controlling an HBM DRAM semiconductor chip. When the first semiconductor chip 110 includes a buffer chip for controlling an HBM DRAM semiconductor chip, the first semiconductor chip 110 may be called a master chip and the HBM DRAM semiconductor chip may be called a slave chip.

Although the first top connection pad 112a is in the first semiconductor substrate 111 in FIG. 1B, embodiments are not limited thereto. In some embodiments, the first top connection pad 112a may protrude from a surface of the first semiconductor substrate 111.

In this specification, the first semiconductor substrate 111 may include a base substrate including a semiconductor material, various conductive material layers and insulating material layers, which are formed on the base substrate to form the first semiconductor element 111a, and a wiring pattern and a wiring via, which are electrically connected to the first semiconductor element 111a. In other words, the first semiconductor substrate 111 may include a semiconductor material as a main component but is not limited thereto.

Each of the second semiconductor chips 120 includes a second semiconductor substrate 121 including a second semiconductor element 121a on an active side, an inner top connection pad 122a and an inner bottom connection pad 122b respectively on the active side and the inactive side of the second semiconductor substrate 121, a second through electrode 123 passing through at least a portion of the second semiconductor substrate 121 and electrically connecting the inner top connection pad 122a to the inner bottom connection pad 122b, and a second protective insulating layer 125 exposing at least a portion of the inner top connection pad 122a and covering the active side of the second semiconductor substrate 121. The second protective insulating layer 125 may include an inorganic material, e.g., an oxide or a nitride. For example, the second protective insulating layer 125 may include at least one of silicon oxide and silicon nitride. In some embodiments, the second protective insulating layer 125 may include silicon nitride.

The second semiconductor substrate 121, the inner top connection pad 122a, the inner bottom connection pad 122b, and the second through electrode 123 are substantially the same as the first semiconductor substrate 111, the first top connection pad 112a, the first bottom connection pad 112b, and the first through electrode 113, respectively. Thus, detailed descriptions thereof will be omitted.

For example, the second semiconductor chips 120 may include a DRAM chip, an SRAM chip, a flash memory chip, an EEPROM chip, a PRAM chip, an MRAM chip, or an RRAM chip. In some embodiments, the second semiconductor chips 120 may include an HBM DRAM semiconductor chip. The first semiconductor chip 110 may be called a master chip, and the second semiconductor chips 120 may be called slave chips.

An inner connector 124 may be attached to the inner top connection pad 122a of each of the second semiconductor chips 120. The inner connector 124 may electrically connect the first bottom connection pad 112b of the first semiconductor chip 110 to the inner top connection pad 122a of a second semiconductor chip 120 or may electrically connect the inner bottom connection pad 122b of each of the second semiconductor chips 120 to the inner top connection pad 122a of another vertically adjacent second semiconductor chip 120.

The inner connector 124 may include an inner conductive pillar 124a on the inner top connection pad 122a and an inner conductive cap 124b on the inner conductive pillar 124a.

An insulating adhesive layer 135 may be between two adjacent chips among the first semiconductor chip 110 and the second semiconductor chips 120. The insulating adhesive layer 135 may include, e.g., a non-conductive film (NCF), a non-conductive paste (NCP), an insulating polymer, or an epoxy resin. The insulating adhesive layer 135 may surround the inner connector 124 and fill between the first semiconductor chip 110 and a second semiconductor chip 120 adjacent thereto or between two adjacent second semiconductor chips 120.

In some embodiments, among the second semiconductor chips 120, a second semiconductor chip 120 on the top farthest from the first semiconductor chip 110 may not include the inner bottom connection pad 122b and the second through electrode 123. In some embodiments, among the second semiconductor chips 120, the second semiconductor chip 120 on the top farthest from the first semiconductor chip 110 may be thicker than the other second semiconductor chips 120, e.g., along a vertical direction perpendicular to the top surface of the first semiconductor substrate 111.

A width and an area of the first semiconductor chip 110 may be respectively greater than those of each of the second semiconductor chips 120, e.g., at least one of the edges of the first semiconductor chip 110 may protrude beyond the second semiconductor chips 120 along a horizontal direction parallel to the top surface of the first semiconductor substrate 111. The first semiconductor device 100 may further include a molding layer 130 on the first semiconductor chip 110, e.g., on a portion of the first semiconductor chip 110 protruding beyond the second semiconductor chips 120, to surround the side surfaces of the second semiconductor chips 120 and the side surface of the insulating adhesive layer 135. For example, the molding layer 130 may include an epoxy mold compound (EMC).

Referring to FIG. 1A, the second semiconductor device 200 may include a third semiconductor substrate 210, the second top connection pad 242, a third protective insulating layer 245, and a second connector 244. The second connector 244 may include the second conductive pillar 244a on the second top connection pad 242 and the second conductive cap 244b on the second conductive pillar 244a. The third semiconductor substrate 210, the second top connection pad 242, the third protective insulating layer 245, and the second connector 244 are substantially similar to the first semiconductor substrate 111, the first top connection pad 112a, the first protective insulating layer 115, and a first connector 114, respectively, or to the second semiconductor substrate 121, the inner top connection pad 122a, the second protective insulating layer 125, and the inner connector 124, respectively. Thus, detailed descriptions thereof will be omitted. For example, the second semiconductor device 200 may include a CPU chip, a GPU chip, or an AP chip.

The first substrate 300 may include a base layer 310, the redistribution structure 357 on a first surface 312 of the base layer 310, and a plurality of pad wiring layers 324 on a second surface 314 of the base layer 310. The redistribution structure 357 may include a redistribution dielectric layer 357_6, the first redistribution pads 357_2 on a surface of the redistribution dielectric layer 357_6, and a plurality of second redistribution pads 357_4 on an opposite surface of the redistribution dielectric layer 357_6. Accordingly, the first redistribution pads 357_2 may be on a top surface of the first substrate 300, and the pad wiring layers 324 may be on a bottom surface of the first substrate 300.

The base layer 310 may include, e.g., a semiconductor material, glass, ceramic, or plastic. For example, the base layer 310 may include silicon. In some embodiments, the base layer 310 may be formed from a silicon semiconductor substrate. A plurality of first substrate through electrodes 330 connecting the first surface 312 to the second surface 314 may be provided in the base layer 310. Each of the first substrate through electrodes 330 may include a conductive plug passing through the base layer 310 and a conductive barrier film surrounding the conductive plug. The conductive plug may have a pillar shape, and the conductive barrier film may have a cylindrical shape surrounding the side wall of the conductive plug. A plurality of via dielectric layers may be between the base layer 310 and the first substrate through electrodes 330 to surround the side walls of the first substrate through electrodes 330.

The redistribution structure 357 may include the redistribution dielectric layer 357_6 and the first and second redistribution pads 357_2 and 357_4, which are respectively on the opposite surfaces of the redistribution dielectric layer 357_6. The second redistribution pads 357_4 may be on the first surface 312 of the base layer 310 and electrically connected to the first substrate through electrodes 330. The first substrate through electrodes 330 may electrically connect the second redistribution pads 357_4 to the pad wiring layers 324.

The redistribution structure 357 may further include a plurality of redistribution lines 357_7 and redistribution vias 357_8, which electrically connect the first redistribution pads 357_2 to the second redistribution pads 357_4. Although the redistribution lines 357_7 are arranged inside the redistribution dielectric layer 357_6 in FIG. 1A, embodiments are not limited thereto.

For example, each of the first redistribution pads 357_2, the second redistribution pads 357_4, the redistribution lines 357_7, and the redistribution vias 357_8 may include copper, nickel, stainless steel, or a copper alloy, e.g., beryllium copper. For example, the redistribution dielectric layer 357_6 may include at least one of oxide, nitride, and photo imagable dielectric (PID). In some embodiments, the redistribution dielectric layer 357_6 may include, e.g., silicon oxide, silicon nitride, epoxy, or polyimide.

A first substrate protection layer 355, the pad wiring layers 324, a plurality of first substrate connectors 340, and a plurality of wiring protection layers 356 may be arranged on the second surface 314 of the base layer 310. The pad wiring layers 324 may be on the first substrate protection layer 355 and connected to the first substrate through electrodes 330, which pass through the first substrate protection layer 355. The first substrate connectors 340 may be on the pad wiring layers 324. The wiring protection layers 356 may surround the first substrate connectors 340 and cover the pad wiring layers 324.

The first substrate 300 may correspond to an interposer.

A first underfill layer 382 may be between the first semiconductor device 100 and the first substrate 300, and a second underfill layer 384 may be between the second semiconductor device 200 and the first substrate 300. The first underfill layer 382 may surround the first connector 114, and the second underfill layer 384 may surround the second connector 244. In some embodiments, the first underfill layer 382 may protrude from a side surface of the first semiconductor device 100 in the lateral direction. In some embodiments, the second underfill layer 384 may protrude from a side surface of the second semiconductor device 200 in the lateral direction.

In some embodiments, at least one of the first underfill layer 382 and the second underfill layer 384 may include an irreversible thermochromic pigment. This will be described in detail below.

The second substrate 400 may include a base board layer 410, a board top pad 422 on a top surface of the base board layer 410, and a board bottom pad 424 on a bottom surface of the base board layer 410. In some embodiments, the second substrate 400 may include a printed circuit board (PCB). For example, the second substrate 400 may include a multi-layer PCB. The base board layer 410 may include at least one material of, e.g., phenol resin, epoxy resin, and polyimide.

A solder resist layer may be formed on each of the top and bottom surfaces of the base board layer 410 and may expose the board top pad 422 or the board bottom pad 424. A first substrate connector 340 may be connected to the board top pad 422, and a package connector 440 may be connected to the board bottom pad 424. The first substrate connector 340 may electrically connect the pad wiring layer 324 to the board top pad 422. The package connector 440 connected to the board bottom pad 424 may connect the semiconductor package 1 to the outside, e.g., to an external device. A board underfill layer 380 may be between the first substrate 300 and the second substrate 400. The board underfill layer 380 may surround a plurality of first substrate connectors 340.

The semiconductor package 1 may further include a package molding layer 800 on the first substrate 300 to surround the side surfaces of the first semiconductor device 100 and the second semiconductor device 200. For example, the package molding layer 800 may include an EMC. For example, the package molding layer 800 may be an additional molding layer external to the molding layer 130 of the first semiconductor device 100, discussed previously with reference to FIG. 1B, e.g., the package molding layer 800 may be integral with and extend laterally from the molding layer 130 to cover entire lateral surface of the first semiconductor device 100.

In some embodiments, the package molding layer 800 may cover the top surface of the first substrate 300 and the side surface of each of the first semiconductor device 100 and the second semiconductor device 200 but not the top surface of each of the first semiconductor device 100 and the second semiconductor device 200. In this case, the semiconductor package 1 may further include a heat dissipation unit 950, e.g., a metal plate, covering the top surfaces of the first semiconductor device 100 and the second semiconductor device 200. The heat dissipation unit 950 may include a heat slug or a heat sink. In some embodiments, the heat dissipation unit 950 may be on a top surface of the second substrate 400 to surround the first semiconductor device 100, the second semiconductor device 200, and the top and side surfaces of the first substrate 300. In some embodiments, the heat dissipation unit 950 may include a metal material and have a flat or solid shape.

In some embodiments, the heat dissipation unit 950 may perform an electromagnetic wave shielding function and a heat dissipation function, and may be connected to the board top pad 422 that is grounded among a plurality of board top pads 422 of the second substrate 400.

The semiconductor package 1 may further include a thermosetting resin layer 900 between the heat dissipation unit 950 and each of the first semiconductor device 100 and the second semiconductor device 200, e.g., the thermosetting resin layer 900 may be between the heat dissipation unit 950 and top surfaces of the first and second semiconductor device 100 and 200. For example, the thermosetting resin layer 900 may extend continuously, e.g., to overlap an entire upper surface of the first substrate 300a, such that upper surfaces of the first semiconductor device 100 and the second semiconductor device 200 and an upper surface of the package molding layer 800, e.g., directly, contact a bottom of the thermosetting resin layer 900. The thermosetting resin layer 900 may be formed of a thermal interface material (TIM) paste that includes an irreversible thermochromic pigment uniformly mixed into a matrix polymer.

In detail, the matrix polymer in the thermosetting resin layer 900 may include a thermosetting resin that may be cross-linked by an initiator and heat. For example, the matrix polymer may include polysiloxane resin, epoxy resin, phenoxy resin, bismaleimide resin, acryl resin, unsaturated polyester, urethane, urea, phenol-formaldehyde, vulcanized rubber, melamine resin, polyimide, epoxy novolac resin, diglycidyl ether of bisphenol A (DGEBA), cyanate ester, or the like. However, embodiments are not limited thereto.

The irreversible thermochromic pigment in the thermosetting resin layer 900 may have a conjugated system of an electron donating material or an electron accepting material and may include a material that changes in the structure thereof at a certain temperature and thus exhibits color. For example, the irreversible thermochromic pigment may include an organic thermochromic pigment, e.g., a leuco dye. The leuco dye may include, e.g., a xanthene leuco dye, a thioxanthene leuco dye, a acridine leuco dye, a phenoxazine leuco dye, a phenazine leuco dye, a merocyanine leuco dye, a thiazine leuco dye, an oxazine leuco dye, an azine leuco dye, a methane leuco dye, an azo leuco dye, a pyrazoline leuco dye, a stilbene leuco dye, a coumarin leuco dye, a triarylmethane leuco dye, a spiropyran leuco dye, a phthalide leuco dye, a fluoran leuco dye, an acryl leuco dye, an auramine leuco dye, a rhodamine-lactam leuco dye, a chromene leuco dye, a quinine leuco dye, an amino hydrocinnamic acid leuco dye, a 2-(p-hydroxyphenyl)-4,5-diphenylimidazole leuco dye, an indanone leuco dye, an indamine leuco dye, a hydrazine leuco dye, an indigoid leuco dye, an amino-2,3-dihydroanthraquinone leuco dye, a tetrahalo-p,p'-biphenol leuco dye, a phenylethyl aniline leuco dye, or a mixture thereof. However, embodiments are not limited thereto.

In some embodiments, the irreversible thermochromic pigment may include a metallic compound including metal, e.g., copper (Cu), manganese (Mn), chromium (Cr), cobalt (Co), nickel (Ni), iron (Fe), or vanadium (V), and an organic ligand coordinated to the metal. In some embodiments, the irreversible thermochromic pigment may include inorganic thermochromic pigment as shown in Table 1 below.

TABLE 1

| Irreversible thermochromic pigment | Change in color | Color change temperature (° C.) |
|---|---|---|
| copper iodide (CuI) | gray-tan → orange | 60-62 |
| 2Cu(CNS)$_2$-2pyridine | green → yellow | 135 |

TABLE 1-continued

| Irreversible thermochromic pigment | Change in color | Color change temperature (° C.) |
|---|---|---|
| | yellow → black | 220 |
| $NH_4VO_3$ | white → brown | 150 |
| | brown → black | 170 |
| $CoCO_2$ | violet → black | 330 |
| $MnNH_4P_2O_7$ | violet → white | 400 |
| $NiC_2O_4$ | light blue → black | 410 |

When an inorganic thermochromic pigment shown in Table 1 is used as the irreversible thermochromic pigment in the thermosetting resin layer 900, the irreversible thermochromic pigment may have an average particle diameter of about 0.5 micrometers (μm) to about 50 μm. When the average particle diameter of the irreversible thermochromic pigment is larger than about 50 μm or smaller than about 0.5 μm, it may be hard to obtain a uniform distribution.

The thermosetting resin layer 900 may have an irreversible thermochromic pigment content of about 0.1 wt % to about 5 wt %, based on a total weight of the thermosetting resin layer 900. When the irreversible thermochromic pigment content is above 5 wt %, the heat dissipation characteristic of the thermosetting resin layer 900 may be degraded. When the irreversible thermochromic pigment content is below 0.1 wt %, a color change effect depending on a temperature change may be insufficient.

Because the thermosetting resin layer 900 includes the irreversible thermochromic pigment, a maximum temperature experienced by the thermosetting resin layer 900 during the manufacture of the semiconductor package 1 may be represented by the color of the inorganic thermochromic pigment. Whether thermal energy applied to the thermosetting resin layer 900 is appropriate may be identified by disassembling a manufactured product and examining the color of the thermosetting resin layer 900. In addition, whether thermal energy has been uniformly applied to the thermosetting resin layer 900 may be identified by examining the uniformity of color of the thermosetting resin layer 900. Accordingly, whether there has been a problem in a process of applying thermal energy during the manufacture of a product may be quickly and easily checked by examining the thermosetting resin layer 900.

The irreversible thermochromic pigment may be selected such that a color change temperature range is about 60° C. to about 400° C. The magnitude of thermal energy applied to manufacture a semiconductor package may be determined, while taking into account the purpose of application of thermal energy, the characteristics of a semiconductor element, the heat resistance of each component, and the like. Accordingly, an irreversible thermochromic pigment having an appropriate color change temperature range may be selected, taking these facts into account.

For example, the irreversible thermochromic pigment may be selected to have a color change temperature that is higher than a hardening temperature of the thermosetting resin layer 900. In this case, because a color-changed portion experiences a temperature that is higher than the hardening temperature of the thermosetting resin layer 900, the overall hardening of the thermosetting resin layer 900 may be quickly and easily checked.

In another example, the irreversible thermochromic pigment may be selected to have a color change temperature that is lower than the hardening temperature of the thermosetting resin layer 900. In this case, because a portion of which the color is not changed does not experience the hardening temperature of the thermosetting resin layer 900, a position at which the hardening of the thermosetting resin layer 900 is insufficient may be quickly and easily detected.

In still another example, at least one of the first underfill layer 382, the second underfill layer 384, and the board underfill layer 380 may include the irreversible thermochromic pigment. That is, since a matrix resin for forming an underfill layer is also a thermosetting resin, when the underfill layer contains the irreversible thermochromic pigment, disassembly of a product may easily determine whether thermal energy has been appropriately and/or uniformly applied to the product by visually checking the color of the underfill layer.

In particular, because the underfill layer surrounds various connectors, e.g., solder bumps, in the lateral direction, the underfill layer is closely linked with a reflow process of the connectors. Accordingly, when a product is disassembled and the color of the underfill layer is checked, whether thermal energy has been appropriately provided for the reflow process may be visually identified quickly and easily.

The TIM paste of the thermosetting resin layer 900 may further include a cross-linking agent and a cross-linking regulator. The TIM paste of the thermosetting resin layer 900 may further include an inorganic filler.

For example, the cross-linking agent may include aliphatic amine, aromatic amine, cycloaliphatic amine, phenalkamine, imidazole, carboxylic acid anhydride, a polyamide-based cross-linking agent, a phenolic cross-linking agent, pyromelitic dianhydride (PMDA), or the like. In another example, the cross-linking agent may include a carboxyl group. In some embodiments, the cross-linking agent may include, for example, formic acid, acetic acid, lactic acid, glutamic acid, oleic acid, rosolic acid, 2,2-Bis (hydroxymethyl)propanoic acid, butanoic acid, propanoic acid, tannic acid, gluconic acid, pentanoic acid, hexanoic acid, hydrobromic acid, hydrochloric acid, uric acid, hydrofluoric acid, sulfuric acid, benzyl glutaric acid, glutaric acid, malic acid, phosphoric acid, oxalic acid, uranic acid, hydrochloride, perchloric acid, gallic acid, phosphorous acid, citric acid, malonic acid, tartaric acid, phthalic acid, cinnamic acid, hexanoic acid, propinoic acid, stearic acid, ascorbic acid, acetylsalicylic acid, azelaic acid, benzilic acid, fumaric acid, or the like. However, embodiments are not limited thereto.

The cross-linking agent may be in an amount of about 10 parts by weight to about 40 parts by weight per hundred parts by weight of the thermosetting resin layer 900. When a cross-linking agent content is below 10 parts or above 40 parts, it may be hard to perform regulation of cross-linking.

The cross-linking regulator may include, e.g., 1-methyl imidazole, 2-methyl imidazole, dimethylbenzyl imidazole, 1-decyl-2-methyl imidazole, benzyldimethylamine, trimethylamine, triethylamine, diethylaminopropylamine, pyridine, 1,8-diazabicyclo[5.4.0]undec-7-ene, 2-heptadecyl imidazole, boron trifluoride monoethylamine, 1-[3(2-hydroxyphenyl)prop-2-enyl]imidazole, or the like. However, embodiments are not limited thereto.

The cross-linking regulator may be in an amount of about 1 part by weight to about 5 parts by weight per hundred parts by weight of the thermosetting resin layer 900. When a cross-linking regulator content is below 1 part or above 5 parts, it may be hard to perform regulation of cross-linking.

For example, the inorganic filler may include a metal particle or a metal oxide particle. In detail, the inorganic filler may include, e.g., an alumina particle, a silica particle, a titania particle, an aluminum particle, a zinc oxide particle, a silver particle, a silver-coated copper particle, or the like. The inorganic filler may enhance the heat dissipation characteristic of the thermosetting resin layer 900.

The inorganic filler may be in an amount of about 0.5 parts by weight to about 10 parts by weight per hundred parts by weight of the thermosetting resin layer 900. When an inorganic filler content is lower than about 0.5 parts, a heat dissipation enhancing effect may be insignificant. When the inorganic filler content is higher than about 10 parts, a weight may be excessively increased, resulting in economic disadvantage.

The TIM paste may be formed and applied to a position, at which the thermosetting resin layer 900 is to be formed. Then, appropriate heat may be applied to the TIM paste, thereby hardened the TIM pasta and converting the TIM paste into the thermosetting resin layer 900 is obtained.

At this time, as discussed previously, the TIM paste may include a matrix polymer, an irreversible thermochromic pigment uniformly dispersed in the matrix polymer, a cross-linking agent, and a cross-linking regulator. The kinds and contents of the matrix polymer, the irreversible thermochromic pigment, the cross-linking agent, and the cross-linking regulator have been described above, and thus, descriptions thereof will not be repeated.

Thermal energy needed to harden the TIM paste may be determined, based on the characteristics of the matrix polymer, the cross-linking agent content, the cross-linking regulator content, and the like. When the TIM paste according to embodiments is used, visual identification may be quickly and easily performed to determine whether thermal energy was appropriately applied during manufacturing of a semiconductor package.

Figure 2:
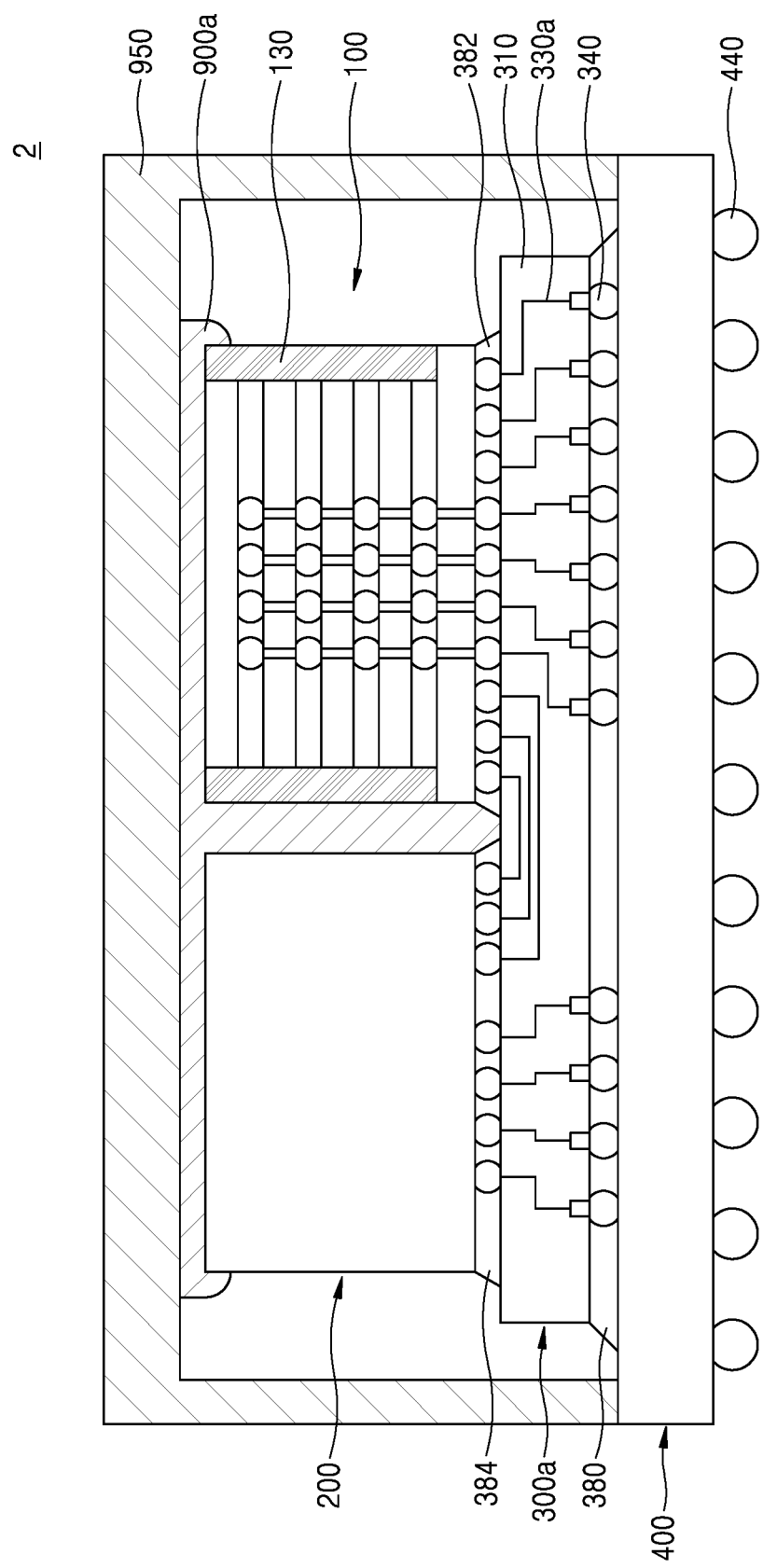
FIGS. 2 through 8 are cross-sectional views of semiconductor packages according to different embodiments.

FIG. 2 is a cross-sectional view of a semiconductor package 2 according to an embodiment. The semiconductor package 2 is different from the semiconductor package 1 of FIGS. 1A and 1B in the configurations of a first substrate 300a and a thermosetting resin layer 900a. Therefore, descriptions will be focused on these differences below.

Referring to FIG. 2, the first substrate 300a may have connection wirings 330a therein, instead of through electrodes. The first semiconductor device 100 and the second semiconductor device 200 may be connected to each other through the connection wirings 330a or may be electrically connected to the second substrate 400 through the first substrate connectors 340. The connection wirings 330a may partially include a through silicon via (TSV).

In some embodiments, the second semiconductor device 200 may include a logic semiconductor device, e.g., an application-specific integrated circuit (ASIC) such as a CPU, a GPU, or a system-on-chip (SoC).

The thermosetting resin layer 900a may extend in the horizontal direction from the top of the first semiconductor device 100 to the top of the second semiconductor device 200. The thermosetting resin layer 900a may at least partially fill the space between the first semiconductor device 100 and the second semiconductor device 200. Like the thermosetting resin layer 900 described with reference to FIGS. 1A and 1B, the thermosetting resin layer 900a may include an irreversible thermochromic pigment.

Figure 3:
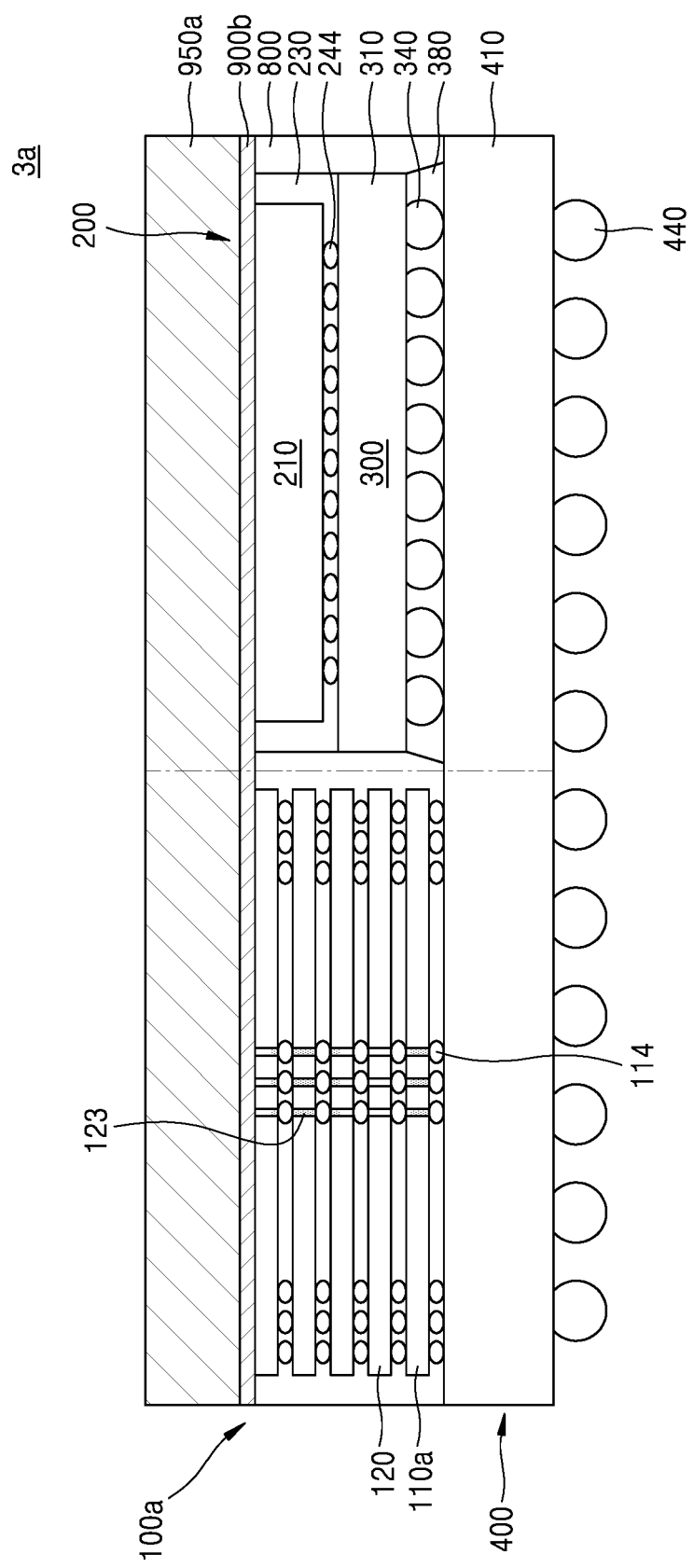

FIG. 3 is a cross-sectional view of a semiconductor package 3a according to an embodiment.

Referring to FIG. 3, in the semiconductor package 3a, the second semiconductor device 200 may be mounted on the first substrate 300, and the first substrate 300 may be mounted on the second substrate 400. A first semiconductor device 100a may be directly mounted on the second substrate 400.

A side surface of the second semiconductor device 200 may be encapsulated by a molding layer 230. The molding layer 230 may include, e.g., an EMC. At this time, a top surface of the second semiconductor device 200 may be exposed from the molding layer 230. The molding layer 230 may fill the space between the second semiconductor device 200 and the first substrate 300.

In some embodiments, the top surfaces of the first and second semiconductor devices 100a and 200 may be in direct contact with a thermosetting resin layer 900b. Like the thermosetting resin layer 900 described with reference to FIGS. 1A and 1B, the thermosetting resin layer 900b may include an irreversible thermochromic pigment.

A heat dissipation unit 950a may be on a top of the thermosetting resin layer 900b. The heat dissipation unit 950a may include, e.g., a heat sink, a heat spreader, a heat pipe, or a liquid cooled cold plate.

The semiconductor package 3a may be formed by arranging the first substrate 300, on which the second semiconductor device 200 is mounted, and the first semiconductor device 100a on the second substrate 400 to be adjacent to each other, and attaching the thermosetting resin layer 900b and the heat dissipation unit 950a thereto.

The second through electrode 123 of the second semiconductor chip 120 on the top among the second semiconductor chips 120 stacked in the first semiconductor device 100a may be in contact with the thermosetting resin layer 900b. The thermosetting resin layer 900b may be electrically non-conductive. When the heat dissipation unit 950a is electrically conductive, the second through electrode 123 may be electrically insulated from the heat dissipation unit 950a by the thermosetting resin layer 900b.

Figure 4:
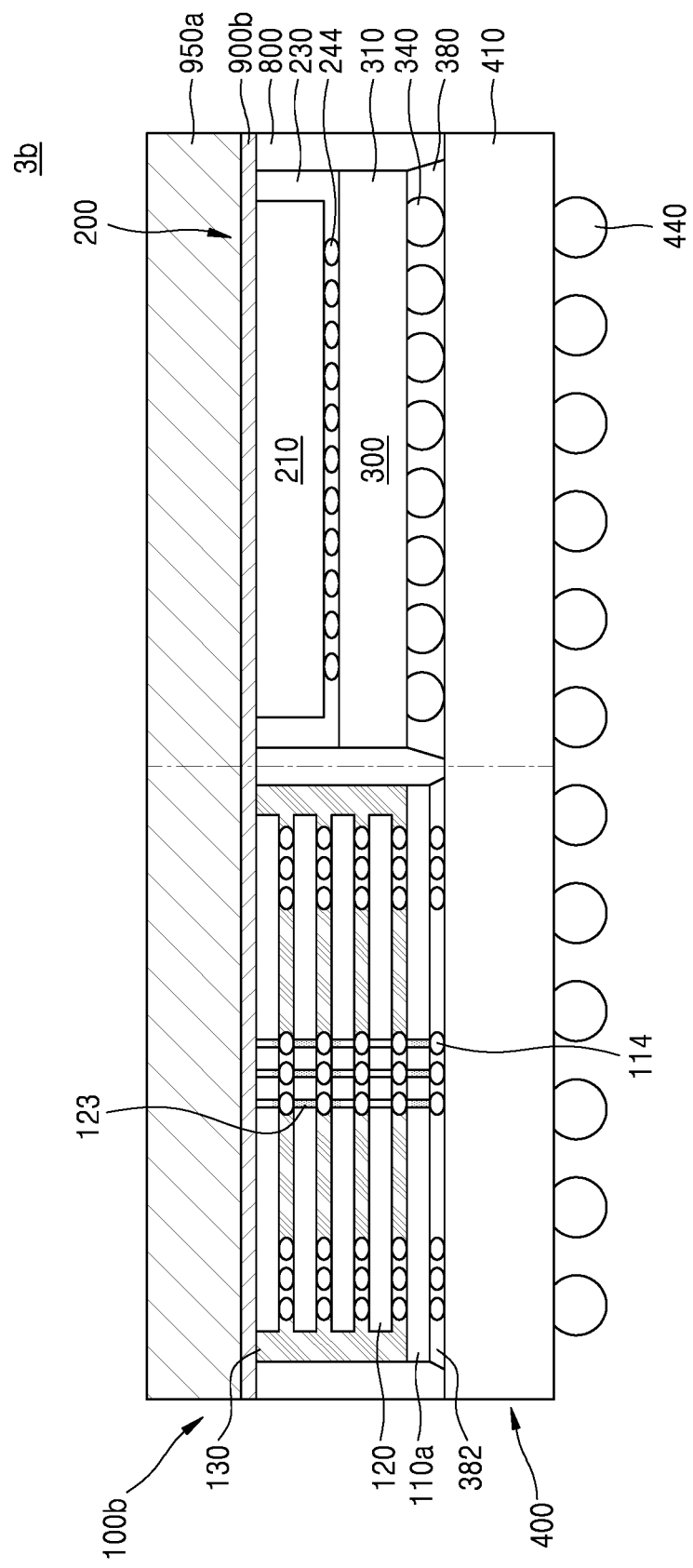

FIG. 4 is a cross-sectional view of a semiconductor package 3b according to an embodiment.

Referring to FIG. 4, in the semiconductor package 3b, the second semiconductor device 200 may be mounted on the first substrate 300, and the first substrate 300 may be mounted on the second substrate 400. A first semiconductor device 100b may be directly mounted on the second substrate 400.

The first semiconductor device 100b may further include the molding layer 130. As described with reference to FIG. 1B, the molding layer 130 may surround the side surfaces of a first semiconductor chip 110a and the second semiconductor chips 120, which are stacked on each other, but may not cover the top surface of the second semiconductor chip 120 on the top of the stack.

The first underfill layer 382 may fill the space between the first semiconductor device 100b and the second substrate 400. The first underfill layer 382 may include, e.g., thermosetting resin. In some embodiments, the first underfill layer 382 may be a portion of the package molding layer 800 formed using, e.g., a molded underfill (MUF) process.

In some embodiments, the top surfaces of the first and second semiconductor devices 100b and 200 may be in direct contact with a thermosetting resin layer 900b. Like the thermosetting resin layer 900 described with reference to FIGS. 1A and 1B, the thermosetting resin layer 900b may include an irreversible thermochromic pigment.

The heat dissipation unit 950a may be on the top of the thermosetting resin layer 900b. The semiconductor package 3b may be formed by arranging the first substrate 300, on which the second semiconductor device 200 is mounted, and the first semiconductor device 100b on the second substrate 400 to be adjacent to each other and attaching the thermosetting resin layer 900b and the heat dissipation unit 950a thereto.

Figure 5:
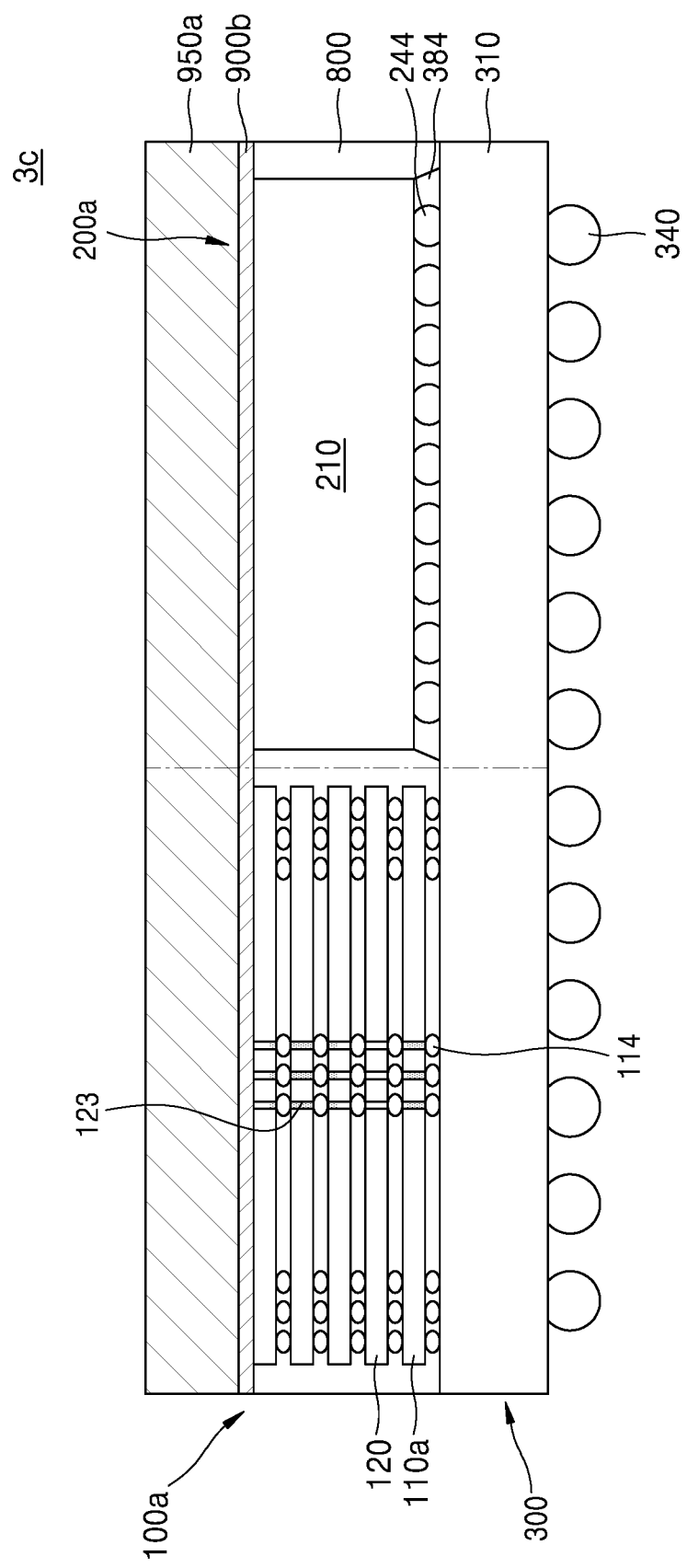

FIG. 5 is a cross-sectional view of a semiconductor package 3c according to an embodiment.

Referring to FIG. 5, in the semiconductor package 3c, the first semiconductor device 100a and a second semiconductor device 200a may be directly mounted on the first substrate 300. The first semiconductor device 100a and the second semiconductor device 200a may be adjacent to each other in the lateral direction.

The second semiconductor device 200a may be attached to the first substrate 300 such that the active side of the second semiconductor device 200a faces the first substrate 300. The second semiconductor device 200a may be electrically connected to the first substrate 300 through the second connector 244 on the active side thereof. The second underfill layer 384 may fill the space between the second semiconductor device 200a and the first substrate 300. In some embodiments, the second semiconductor device 200a may include a wafer level package (WLP).

In some embodiments, the top surfaces of the first and second semiconductor devices 100a and 200a may be in direct contact with a thermosetting resin layer 900b. Like the thermosetting resin layer 900 described with reference to FIGS. 1A and 1B, the thermosetting resin layer 900b may include an irreversible thermochromic pigment.

Figure 6:
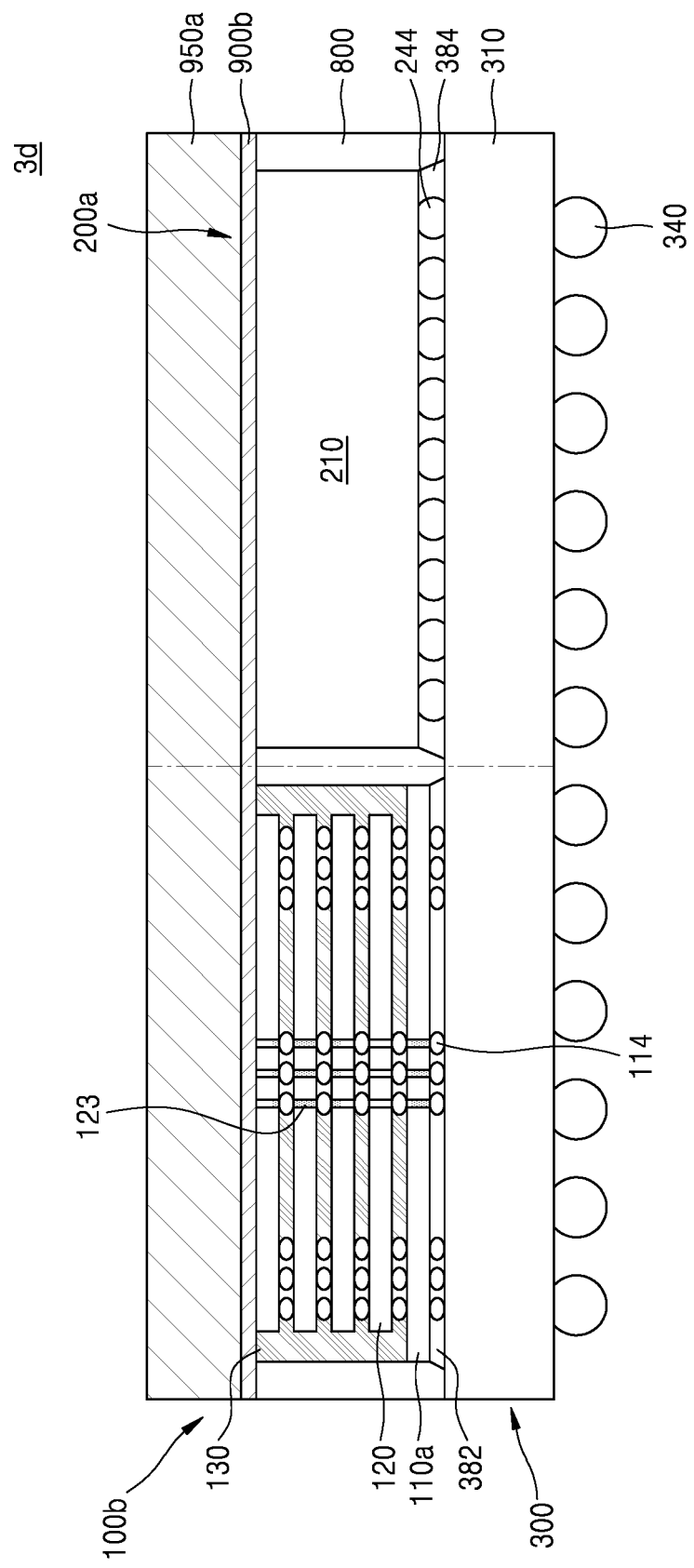

FIG. 6 is a cross-sectional view of a semiconductor package 3d according to an embodiment.

Referring to FIG. 6, in the semiconductor package 3d, the first semiconductor device 100b and the second semiconductor device 200a may be directly mounted on the first substrate 300. The first semiconductor device 100b and the second semiconductor device 200a may be adjacent to each other in the lateral direction.

The first semiconductor device 100b may further include the molding layer 130. As described with reference to FIG. 1B, the molding layer 130 may surround the side surfaces of the first semiconductor chip 110a and the second semiconductor chips 120, which are stacked on each other, but may not cover the top surface of the second semiconductor chip 120 on the top of the stack.

In some embodiments, the top surfaces of the first and second semiconductor devices 100b and 200a may be in direct contact with the thermosetting resin layer 900b. Like the thermosetting resin layer 900 described with reference to FIGS. 1A and 1B, the thermosetting resin layer 900b may include an irreversible thermochromic pigment.

Figure 7:
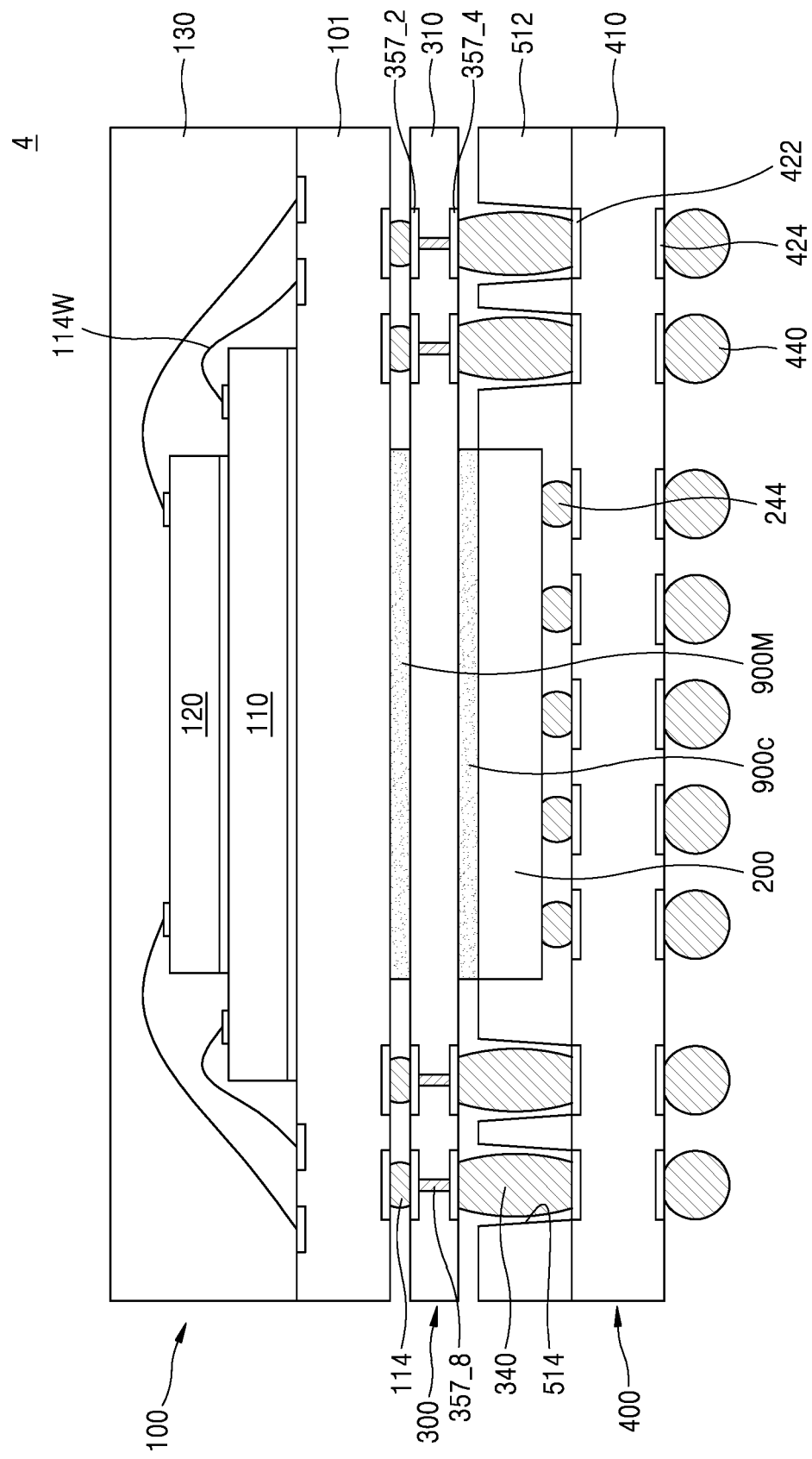

FIG. 7 is a cross-sectional view of a semiconductor package 4 according to an embodiment.

Referring to FIG. 7, the first semiconductor device 100 is mounted on the first substrate 300, and the second semiconductor device 200 is mounted on the second substrate 400.

A lower mold film 512 is on the second substrate 400. The lower mold film 512 has a connection hole 514 exposing a board top pad 422. A first substrate connector 340 attached to a second redistribution pad 357_4 of the first substrate 300 may be coupled to the board top pad 422 through the connection hole 514.

The lower mold film 512 may cover the side wall of the second semiconductor device 200 and expose the top surface of the second semiconductor device 200. In other words, the top surface of the second semiconductor device 200 may not be covered with the lower mold film 512.

A thermosetting resin layer 900c may be on the top surface of the second semiconductor device 200. The thermosetting resin layer 900c may be in contact with the top surface of the second semiconductor device 200. Furthermore, the thermosetting resin layer 900c may be in contact with the bottom surface of the first substrate 300. Like the thermosetting resin layer 900 described with reference to FIGS. 1A and 1B, the thermosetting resin layer 900c may include an irreversible thermochromic pigment.

A metal plate 900M may be on the top surface of the first substrate 300 to overlap the thermosetting resin layer 900c. The metal plate 900M may entirely or partially overlap the thermosetting resin layer 900c. In some embodiments, the metal plate 900M may be a portion of a metal wiring provided on the top surface of the first substrate 300.

The first semiconductor chip 110 and the second semiconductor chip 120 of the first semiconductor device 100 may be mounted on a sub package substrate 101. Although each of the first and second semiconductor chips 110 and 120 is electrically connected to the sub package substrate 101 by a bonding wire 114W in FIG. 7, the first and second semiconductor chips 110 and 120 may be flip-chip bonded to the sub package substrate 101.

Figure 8:
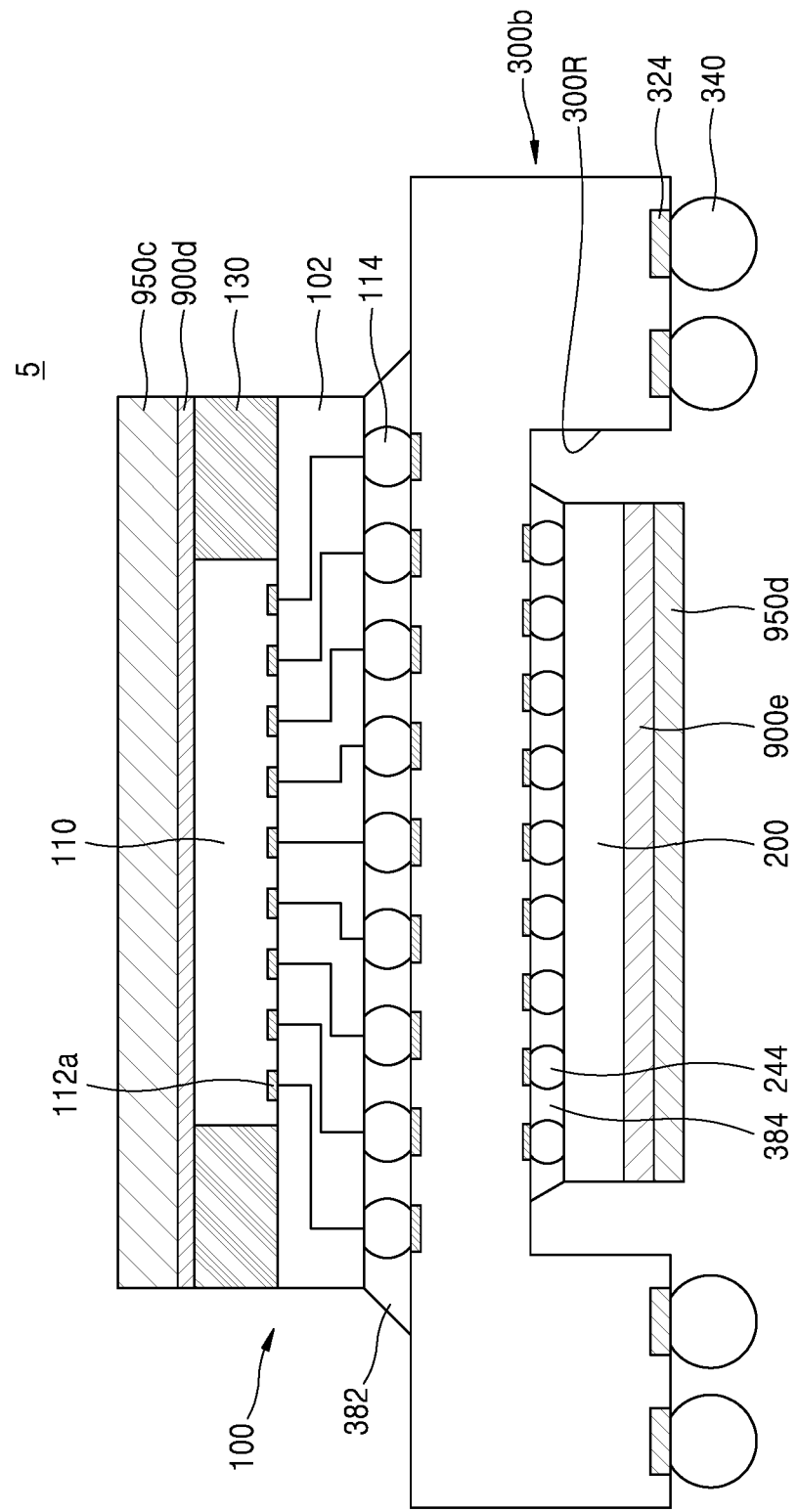

FIG. 8 is a cross-sectional view of a semiconductor package 5 according to an embodiment.

Referring to FIG. 8, the first semiconductor device 100 and the second semiconductor device 200 are respectively mounted on two different surfaces of a first substrate 300b.

The first semiconductor device 100 is on a surface of the first substrate 300b. The first semiconductor device 100 may include the first semiconductor chip 110 and a fan-out layer 102 on the active side of the first semiconductor chip 110. The fan-out layer 102 may correspond to a fan-out redistribution layer or an interposer.

The first semiconductor device 100 may be electrically connected to the first substrate 300b by the first connector 114. The first underfill layer 382 may fill the space between the first semiconductor chip 110 and the first substrate 300b.

The side surface of the first semiconductor chip 110 may be encapsulated by the molding layer 130. The molding layer 130 may include, e.g., an EMC. The top surface of the first semiconductor device 100 may be in direct contact with a first thermosetting resin layer 900d. Like the thermosetting resin layer 900 described with reference to FIGS. 1A and 1B, the first thermosetting resin layer 900d may include an irreversible thermochromic pigment.

A first heat dissipation unit 950c may be on a top of the first thermosetting resin layer 900d. The heat dissipation unit 950c may include, e.g., a heat sink, a heat spreader, a heat pipe, or a liquid cooled cold plate.

The first substrate 300b may have a recess 300R on an opposite surface thereof. The second semiconductor device 200 may be arranged in the recess 300R. The second semiconductor device 200 may be electrically connected to the first substrate 300b through the second connector 244 on the active side thereof. The second underfill layer 384 may fill the space between the second semiconductor device 200 and the first substrate 300b.

The bottom surface of the second semiconductor device 200 may be in direct contact with a second thermosetting resin layer 900e. A second heat dissipation unit 950d may be on a surface of the second thermosetting resin layer 900e. Although the second heat dissipation unit 950d has a flat shape in FIG. 8, the second heat dissipation unit 950d may vertically extend to the side surface of the second semiconductor device 200. Furthermore, the second heat dissipation unit 950d may be electrically connected to a ground terminal of the first substrate 300b.

By way of summation and review, embodiments provide a semiconductor package in which a visual determination may be made quickly and easily regarding appropriateness of use of thermal energy during the manufacture of the semiconductor package. Embodiments also provide a thermal interface material (TIM) paste for the semiconductor package.

That is, an irreversible thermochromic pigment having an appropriate color change temperature range may be included in the TIM paste of the semiconductor package, so that it may be possible to easily and quickly inspect, after ending the manufacturing processes, whether appropriate thermal energy has been applied to the TIM paste and/or whether the thermal energy has been uniformly applied to the TIM paste. In this case, it may be possible to trace the source of heat, thereby facilitating removal of the heat.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   at least one semiconductor device mounted on a first substrate;
   a thermosetting resin layer on the at least one semiconductor device, the thermosetting resin layer including an irreversible thermochromic pigment at a content of about 0.1 wt % to about 5 wt %, based on a total weight of the thermosetting resin layer;
   a metal plate on the thermosetting resin layer; and
   a molding member surrounding the at least one semiconductor device at least in a lateral direction and being in contact with the thermosetting resin layer.

2. A semiconductor package, comprising:
   at least one semiconductor device mounted on a first substrate;
   a thermosetting resin layer on the at least one semiconductor device, the thermosetting resin layer including an irreversible thermochromic pigment;
   a metal plate on the thermosetting resin layer, the metal plate being in contact with the thermosetting resin layer; and
   a molding member surrounding the at least one semiconductor device at least in a lateral direction and being in contact with the thermosetting resin layer,
   wherein a side surface of the thermosetting resin layer that faces away from the at least one semiconductor device is coplanar with a side surface of the molding member that faces away from the at least one semiconductor device.

3. The semiconductor package as claimed in claim 1, wherein the irreversible thermochromic pigment changes in color at a temperature range of about 60° C. to about 400° C.

4. The semiconductor package as claimed in claim 1, wherein the irreversible thermochromic pigment has an average particle diameter of about 0.5 μm to about 50 μm.

5. The semiconductor package as claimed in claim 1, wherein the thermosetting resin layer further includes a cross-linking agent and a cross-linking regulator.

6. The semiconductor package as claimed in claim 5, wherein the thermosetting resin layer further includes one of a metal particle and a metal oxide particle.

7. The semiconductor package as claimed in claim 5, wherein the irreversible thermochromic pigment has a color change temperature that is higher than a hardening temperature of the thermosetting resin layer.

8. The semiconductor package as claimed in claim 5, wherein the irreversible thermochromic pigment has a color change temperature that is lower than a hardening temperature of the thermosetting resin layer.

9. The semiconductor package as claimed in claim 2,
   wherein the at least one semiconductor device includes a first semiconductor device and a second semiconductor device on the first substrate, the first semiconductor device and the second semiconductor device being spaced apart from each other in a lateral direction, and
   wherein the thermosetting resin layer horizontally extends from a top of the first semiconductor device to a top of the second semiconductor device.

10. The semiconductor package as claimed in claim 9, wherein the thermosetting resin layer at least partially fills a space between the first semiconductor device and the second semiconductor device.

11. The semiconductor package as claimed in claim 1, wherein the thermosetting resin layer is electrically non-conductive.

12. The semiconductor package as claimed in claim 1, wherein the thermosetting resin layer is in direct contact with the metal plate.

13. The semiconductor package as claimed in claim 12, wherein the metal plate entirely surrounds a top and a side of the at least one semiconductor device.

14. The semiconductor package as claimed in claim 1, wherein the first substrate is mounted on a second substrate, the second substrate being a printed circuit board.

15. A semiconductor package, comprising:
   at least one semiconductor device on a first substrate;
   a first thermosetting resin layer on a top of the at least one semiconductor device;
   a second thermosetting resin layer between a bottom of the at least one semiconductor device and the first substrate, at least one of the first thermosetting resin layer and the second thermosetting resin layer including an irreversible thermochromic pigment; and
   a metal plate on the first thermosetting resin layer.

16. The semiconductor package as claimed in claim 15, wherein the second thermosetting resin layer protrudes from a side surface of the at least one semiconductor device in a lateral direction.

17. The semiconductor package as claimed in claim 15, wherein the metal plate is electrically connected to a ground terminal of the semiconductor package.

18. The semiconductor package as claimed in claim 15, further comprising a molding member surrounding the at least one semiconductor device at least in a lateral direction, the molding member contacting the at least one of the first thermosetting resin layer and the second thermosetting resin layer.

* * * * *